United States Patent
Wu

(10) Patent No.: US 10,635,235 B2
(45) Date of Patent: Apr. 28, 2020

(54) PHOTOELECTRIC SENSOR AND DRIVING METHOD THEREOF, ARRAY SUBSTRATE AND DISPLAY DEVICE

(71) Applicant: BOE TECHNOLOGY GROUP CO., LTD., Beijing (CN)

(72) Inventor: Chunwei Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 201 days.

(21) Appl. No.: 15/307,789

(22) PCT Filed: Feb. 14, 2016

(86) PCT No.: PCT/CN2016/073769
§ 371 (c)(1),
(2) Date: Oct. 28, 2016

(87) PCT Pub. No.: WO2017/036094
PCT Pub. Date: Mar. 9, 2017

(65) Prior Publication Data
US 2017/0269782 A1 Sep. 21, 2017

(30) Foreign Application Priority Data
Sep. 2, 2015 (CN) .......................... 2015 1 0557736

(51) Int. Cl.
*G06F 3/041* (2006.01)
*G06F 3/042* (2006.01)
(Continued)

(52) U.S. Cl.
CPC ............ *G06F 3/0418* (2013.01); *G06F 3/042* (2013.01); *H01L 27/124* (2013.01);
(Continued)

(58) Field of Classification Search
CPC ...... G06F 3/0418; G06F 3/042; G06F 3/0412; H01L 27/1222; H01L 27/124;
(Continued)

(56) References Cited

U.S. PATENT DOCUMENTS

| 6,947,102 B2 | 9/2005 | den Boer et al. |
| 2003/0076295 A1 | 4/2003 | Nakajima |

(Continued)

FOREIGN PATENT DOCUMENTS

| CN | 1424639 A | 6/2003 |
| CN | 101543059 A | 9/2009 |

(Continued)

OTHER PUBLICATIONS

Office Action in Chinese Application No. 201510557736.3 dated Aug. 28, 2017, with English translation.
(Continued)

*Primary Examiner* — Sejoon Ahn
(74) *Attorney, Agent, or Firm* — Womble Bond Dickinson (US) LLP

(57) ABSTRACT

The present disclosure provides a photoelectric sensor and driving method thereof, as well as an array substrate and a display device. The photoelectric sensor comprises a photoelectric element having an output terminal and a reference level input terminal, an amplifying transistor, a readout transistor, a reset transistor, a capacitor and a plurality of control input terminals. The output terminal of the photoelectric element, the gate of the amplifying transistor and the source of the reset transistor are connected to a first terminal of the capacitor. The reference level input terminal, the sources of the readout transistor and amplifying transistor are connected to a first reference voltage input terminal. The drains of the reset transistor and amplifying transistor are connected to a second reference voltage input terminal. The (Continued)

gates of the read-out transistor and reset transistor are respectively connected to a control input terminal.

16 Claims, 2 Drawing Sheets

(51) Int. Cl.
    *H01L 27/12*         (2006.01)
    *H01L 31/0376*     (2006.01)
    *H01L 31/103*      (2006.01)
    *H01L 31/113*      (2006.01)
    *G02F 1/133*       (2006.01)

(52) U.S. Cl.
    CPC ...... *H01L 27/1222* (2013.01); *H01L 27/1255* (2013.01); *H01L 31/03762* (2013.01); *H01L 31/103* (2013.01); *H01L 31/1136* (2013.01); *G02F 2001/13312* (2013.01); *G06F 3/0412* (2013.01)

(58) Field of Classification Search
    CPC ........... H01L 27/1255; H01L 31/03762; H01L 31/103; H01L 31/1136; G02F 2001/13312
    See application file for complete search history.

(56) References Cited

U.S. PATENT DOCUMENTS

| | | | |
|---|---|---|---|
| 2006/0033729 A1* | 2/2006 | Yoshida | G06F 3/0412 345/207 |
| 2008/0122804 A1* | 5/2008 | Kinoshita | G06F 1/3203 345/175 |
| 2009/0310007 A1 | 12/2009 | Matsui et al. | |
| 2010/0097354 A1 | 4/2010 | Ahn et al. | |
| 2010/0134457 A1 | 6/2010 | Katoh et al. | |
| 2011/0096049 A1* | 4/2011 | Katoh | G06F 3/0412 345/207 |
| 2011/0128428 A1 | 6/2011 | Takatoku et al. | |
| 2011/0205411 A1* | 8/2011 | Voronov | H04N 5/341 348/294 |
| 2011/0221708 A1* | 9/2011 | Murai | G09G 3/3648 345/175 |
| 2012/0091321 A1* | 4/2012 | Tanaka | G06F 3/0412 250/208.2 |
| 2012/0113060 A1* | 5/2012 | Katoh | G01J 1/4204 345/175 |
| 2013/0057518 A1* | 3/2013 | Sugita | G06F 3/0412 345/175 |
| 2013/0068961 A1* | 3/2013 | Tajima | A61B 6/4233 250/394 |
| 2013/0088628 A1* | 4/2013 | Itano | H04N 5/3658 348/308 |
| 2013/0113768 A1* | 5/2013 | Yamamoto | G06F 3/0412 345/207 |
| 2014/0008704 A1* | 1/2014 | Fukuyama | H01L 27/14812 257/231 |
| 2014/0211106 A1 | 7/2014 | Shi et al. | |
| 2015/0028762 A1* | 1/2015 | Qi | G09G 3/3233 315/210 |

FOREIGN PATENT DOCUMENTS

| | | |
|---|---|---|
| CN | 101647049 A | 2/2010 |
| CN | 105044955 A | 11/2015 |
| EP | 2053846 A1 | 4/2009 |
| JP | 2009146173 A | 7/2009 |

OTHER PUBLICATIONS

International Search Report and Written Opinion in PCT/CN2016/073769 dated Jun. 12, 2016, with English translation. 16 pages.

"Second office action," CN Application No. 201510557736.3 (dated Apr. 20, 2018).

Supplementary European Search Report and Written Opinion received for EP Patent Application No. 16784367.1, dated Mar. 7, 2019, 10 pages.

* cited by examiner

# PHOTOELECTRIC SENSOR AND DRIVING METHOD THEREOF, ARRAY SUBSTRATE AND DISPLAY DEVICE

RELATED APPLICATIONS

The present application is the U.S. national phase entry of PCT/CN2016/073769 with an International filing date of Feb. 14, 2016, which claims the benefit of Chinese Application No. 201510557736.3, filed on Sep. 2, 2015, the entire disclosures of which are incorporated herein by reference.

TECHNICAL FIELD

The present disclosure relates to the field of display technology, and more particularly to a photoelectric sensor and driving method thereof, as well as an array substrate and a display device.

BACKGROUND ART

When an a-Si TFT (Thin-Film Transistor) is exposed to visible light, it may generate a great photocurrent. In a TFT-LCD (Thin-Film Transistor Liquid Crystal Display), for guaranteeing a relatively low leakage current, the channel of the a-Si TFT needs to be shaded from light as much as possible. For instance, there is metal on the backlight side to block backlight and a black matrix on a colour-film glass substrate on the other side to block ambient light. In fact, the leakage current of the a-Si TFT changes accordingly under different light intensities. The brighter the light is, the larger the leakage current will become. Such current is called photocurrent.

With the characteristics of the a-Si TFT photocurrent, it is possible to achieve the photoelectric conversion and optical input, and further to implement an integrated optical touch screen on the TFT-LCD so as to realize integrated touch display manufacturing.

The photoelectric sensor of the prior art optical touch screen, as shown in FIG. 1, consists of a photoelectric TFT $T_1$ for converting an optical signal into an electric signal, a readout TFT $T_3$ for reading the electrical signal to an external circuit for further processing, and a capacitor C1 for maintaining the stability of the electrical signal. In practical application, the drain of the readout TFT $T_3$ is connected to a read line that is usually connected to other readout TFTs. When the electric signal of the current photoelectric sensor is read out, other readout TFTs, even without being turned on, will also generate some leakage currents, which will give rise to noise and render it impossible to detect correctly whether a corresponding position has been touched or not.

SUMMARY

It is desirable to solve the above problem of the current photoelectric sensor. It is also desirable to improve the signal-to-noise ratio of the electric signal detected by a reading line.

According to one aspect, there is provided a photoelectric sensor. The photoelectric sensor comprises a photoelectric element, an amplifying transistor, a readout transistor, a reset transistor and a capacitor, and has a plurality of control input terminals. Wherein the photoelectric element comprises an output terminal and a reference level input terminal. The output terminal of the photoelectric element, the gate of the amplifying transistor and the source of the reset transistor are connected to a first terminal of the capacitor. The reference level input terminal of the photoelectric element and the source of the readout transistor are connected to a first reference voltage input terminal. The drain of the reset transistor and the drain of the amplifying transistor are connected to a second reference voltage input terminal. The gate of the read-out transistor and the gate of the reset transistor are respectively connected to a control input terminal.

Optionally, the photoelectric element comprises a photoelectric transistor, the drain of the photoelectric transistor is connected to the output terminal of the photoelectric element, the source thereof is connected to the reference level input terminal of the photoelectric element, and the gate thereof is connected to a control input terminal.

Optionally, the first reference voltage is high voltage, and the second reference voltage is low voltage.

Optionally, the read-out transistor and the reset transistor conduct at the same level.

Optionally, each of the transistors is an N-type transistor.

Optionally, the gate of the photoelectric transistor is connected to the second reference voltage input terminal.

Optionally, the second terminal of the capacitor is connected to the second reference voltage input terminal.

Optionally, the photoelectric element comprises a photoelectric diode, the anode of the photoelectric diode is connected to the output terminal of the photoelectric element, and the cathode thereof is connected to the reference level input terminal of the photoelectric element.

According to the second aspect, there is provided an array substrate. The array substrate comprises a base, and a plurality of gate lines and data lines formed on the base, the plurality of gates and data lines dividing the array substrate into a plurality of pixel areas. The array substrate further comprises a photoelectric sensor formed on the base, the photoelectric sensor being any photoelectric sensor as stated above.

Optionally, the readout transistor and the reset transistor conduct at the same level. Each photoelectric sensor is arranged between two adjacent gate lines. The control input terminal, to which the gate of the readout transistor is connected, is connected to the upper gate line of the two adjacent gate lines, and the readout transistor is adapted to conduct when a gate scanning pulse is applied to the gate line. The control input terminal, to which the gate of the reset transistor is connected, is connected to the lower gate line of the two adjacent gate lines, and the reset transistor is adapted to conduct when a gate scanning pulse is applied to the gate line.

According to the third aspect, there is provided a method for driving any photoelectric sensor as stated above. The method comprises the steps of:

in a readout phase, applying a control signal to a control input terminal to which the gate of the readout transistor is connected so as to make the readout transistor conduct; and in a reset phase, applying a control signal to a control input terminal to which the gate of the reset transistor is connected so as to make the reset transistor conduct.

According to the fourth aspect, there is provided a display device. The display device comprises any array substrate as stated above.

In the photoelectric sensor provided by the present disclosure, there is an amplifying transistor for amplifying electric signals written into the capacitor, to thereby amplify the intensity of the readout signals in the readout phase, and improve the signal-to-noise ratio of the readout signal in an effort to facilitate improvement of the precision of photoelectric detection.

BRIEF DESCRIPTION OF DRAWINGS

To explain the technical solutions of the embodiments more clearly, the drawings to be used in the Detailed Description will be briefly introduced below. It should be realized that the drawings in the following description are only related to some embodiments. Those skilled in the art can further obtain other drawings that fall within the scope of the present invention according to these drawings without making an inventive labour.

DETAILED DESCRIPTION

The specific implementations will be explained in detail with reference to the drawings and embodiments, such that those skilled in the art can better understand the object, technical solutions and advantages of the present invention. The embodiments described herein are used for explaining the solutions of the disclosure in a clearer manner, rather than limiting the scope of the present invention.

Figure 1:
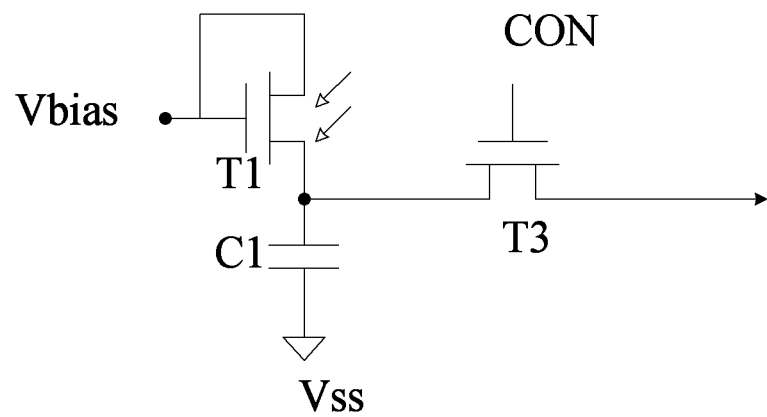
FIG. 1 is a structural schematic view of a photoelectric sensor in the prior art.
Figure 2:
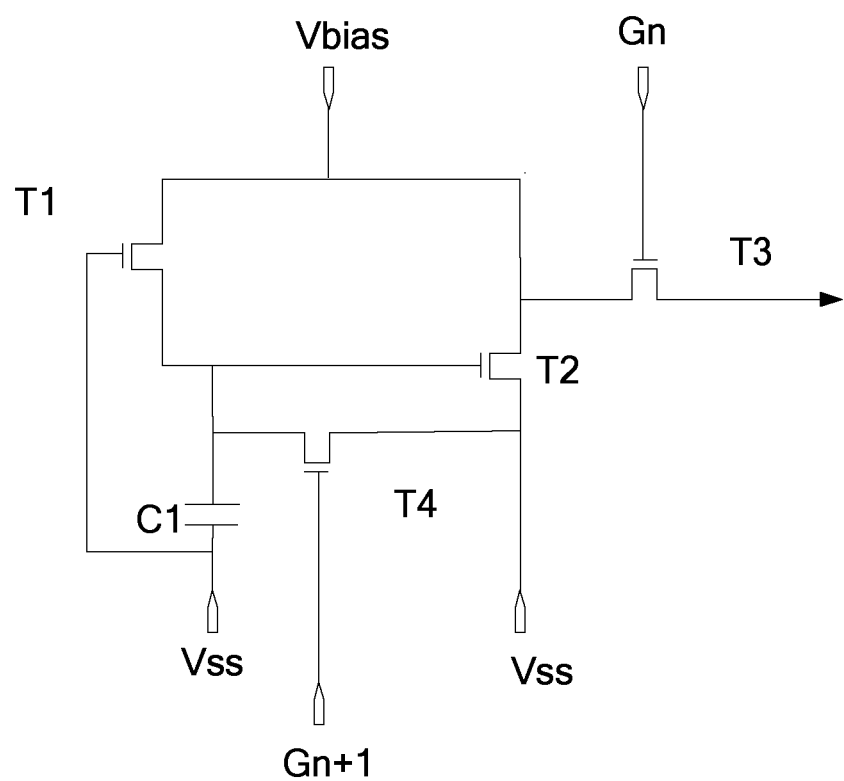
FIG. 2 is a structural schematic view of the photoelectric sensor according to an embodiment.

There is provided a photoelectric sensor according to an embodiment. The photoelectric sensor comprises a photoelectric element for converting optical signals into electric signals so as to be output from an output terminal. In the embodiment, the photoelectric element comprises a photoelectric transistor T1. The drain of the photoelectric transistor T1 constitutes the output terminal of the photoelectric element, and the source thereof constitutes the reference level input terminal of the photoelectric element. Optionally, the gate of the photoelectric transistor T1 corresponds to a control input terminal. In a specific implementation, as shown in FIG. 2, the photoelectric sensor can comprise the photoelectric transistor T1, an amplifying transistor T2, a readout transistor T3, a reset transistor T4, which are all N-type transistors, and a capacitor C1. Wherein the drain of the photoelectric transistor T1, the gate of the amplifying transistor T2 and the source of the reset transistor T4 can be connected to the first terminal of the capacitor C1, and the source of the readout transistor T3 can be connected to the source of the amplifying transistor T2. The source of the photoelectric transistor T1, the source of the amplifying transistor T2, and the source of the readout transistor T3 can be connected to the first reference voltage (shown in the drawings as high voltage) input terminal Vbias. The drain of the reset transistor T4 and the drain of the amplifying transistor T2 are connected to the second reference voltage (shown in the drawings as low voltage) input terminal Vss. The gate of the photoelectric transistor T1, the gate of the readout transistor T3 and the gate of the reset transistor T4 are respectively connected to a control input terminal. In a specific implementation, the gate of the photoelectric transistor T1 can be connected to the low voltage input terminal Vss, the gate of the readout transistor T3 can be connected to a control signal input terminal Gn, and the gate of the reset transistor T4 can be connected to another control signal input terminal Gn+1. Additionally, the second terminal of the capacitor C1 can also be connected to the low voltage input terminal Vss.

Figure 3:
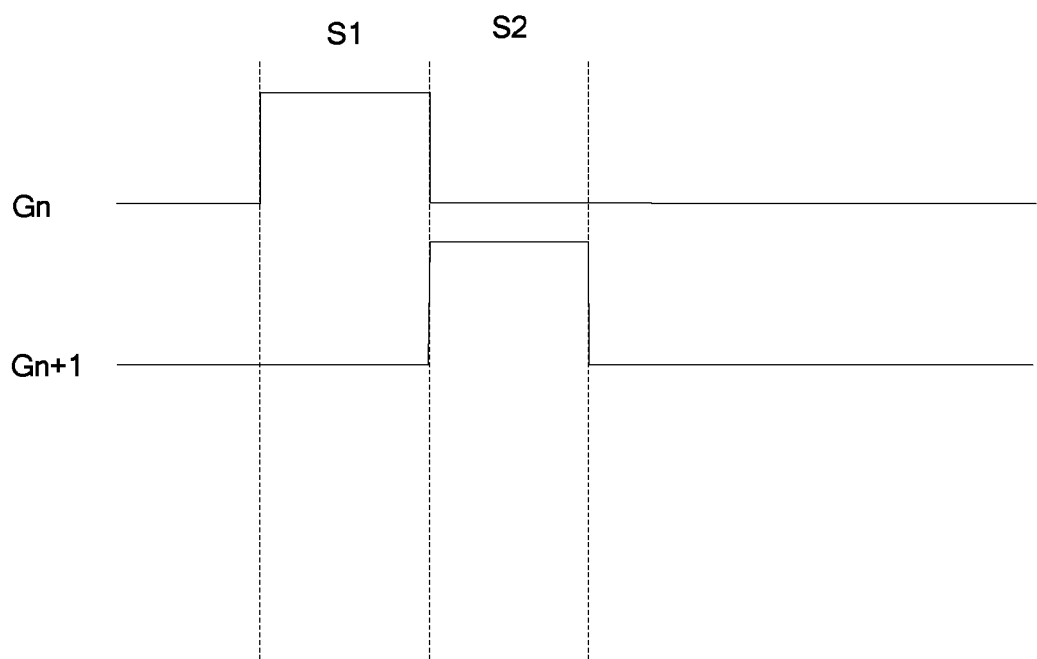
FIG. 3 is a sequence diagram of key signals when driving the photoelectric sensor as shown in FIG. 2.

FIG. 3 is a sequence diagram of key signals when driving the photoelectric sensor as shown in FIG. 2. The method for driving the photoelectric transistor as shown in FIG. 2 can be described with reference to FIG. 3. The method comprises the steps of:

in a readout phase S1, applying a control signal to a control signal input terminal Gn so as to make a readout transistor T3 conduct; and in a reset phase S2, applying a control signal to a control signal input terminal Gn+1 so as to make the reset transistor T4 conduct and thereby reset the first terminal of the capacitor C1.

In a specific implementation, if the readout transistor T3 and the reset transistor T4 are both N-type transistors, the control signal herein may be identical high-level pulses that allow the readout transistor T3 and the reset transistor T4 to conduct respectively.

In the above embodiment, due to the amplifying transistor T2, the current read out by the readout transistor T3 is amplified multiple times as compared with the current directly read out from the first terminal of the capacitor C1 (the amplified times is a constant in relation to the structure of the amplifying transistor), that is, the useful signal among the signals read by the reading line is amplified, and the signal-to-noise ratio is increased accordingly, thereby improving the precision of photoelectric detection.

In some embodiments, the readout transistor T3 and the reset transistor T4 conduct at the same level. In doing so, the advantage lies in that driving signals in the upper gate line of the two adjacent gate lines can make the readout transistor T3 conduct to complete the process of reading out signals. Then, driving signals in the lower gate line of the two adjacent gate lines are used to make the reset transistor T4 conduct to complete the process of resetting the first terminal of the capacitor C1. Of course, in practical application, the readout transistor T3 and the reset transistor T4 may conduct at different levels and are driven by other signal lines. Corresponding technical solutions which can realize the fundamental object of the present invention shall also fall within the scope of the present invention.

In some embodiments, the transistors are all N-type transistors, in such a manner that they can be manufactured by the same process with less difficulty. As far as the realization of the fundamental object of the present invention is concerned, some transistors among the abovementioned transistors may also be replaced by P-type transistors. Corresponding technical solutions shall also fall within the scope of the present invention. If the readout transistor T3 is a P-type transistor, the control signal applied to the gate of the readout transistor T3 in the readout phase may be a low-level pulse. Correspondingly, if the reset transistor T4 is a P-type transistor, the control signal applied to the gate of the reset transistor T4 in the reset phase may be a low-level pulse.

In some embodiments, the gate of the photoelectric transistor T1 is also connected to a second reference voltage or a low-voltage input terminal Vss, so as to put the photoelectric transistor T1 in an off state by sharing a low-voltage input terminal and allow the photoelectric transistor T1 to sense light changes to produce electric currents accordingly.

In some embodiments, the second terminal of the capacitor C1 can also be connected to the low-voltage input terminal Vss, so as to stabilize the voltage at the second terminal of the capacitor C1 and prevent voltage variation caused by static electricity or other factors, and further prevent voltage variation at the first terminal of the capacitor C1 caused by the voltage variation at the second terminal of the capacitor C1.

Figure 4:
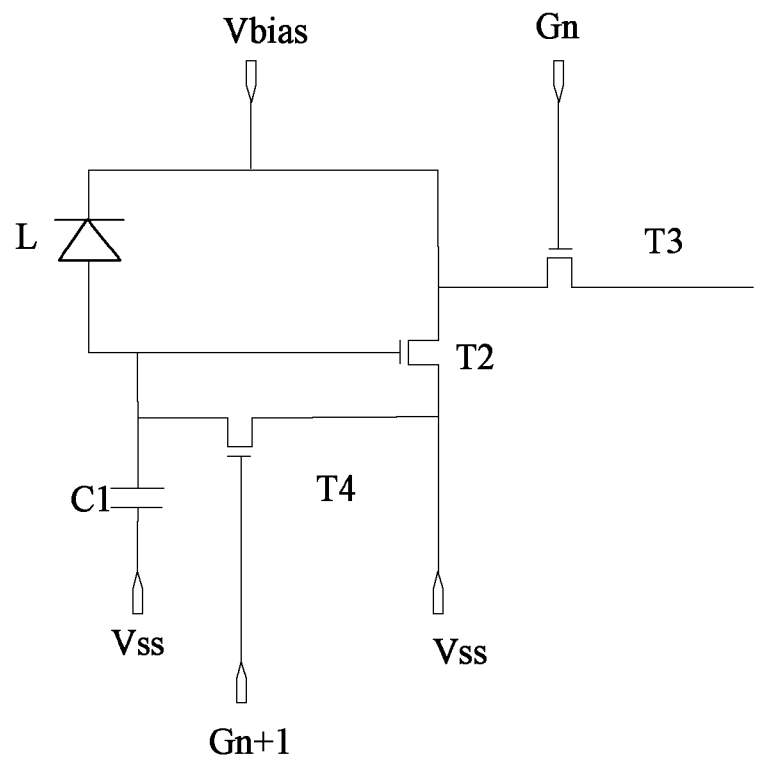
FIG. 4 is a structural schematic view of the photoelectric sensor according to a further embodiment.

FIG. 4 can be referred to for the structure of the photoelectric sensor provided by another embodiment. Different from the structure of the photoelectric sensor in FIG. 2, the photoelectric element of this photoelectric sensor comprises a photoelectric diode L, that is, the photoelectric diode L is used to substitute the photoelectric transistor T1. The anode of the photoelectric diode L constitutes the output terminal of the photoelectric element, and the cathode thereof constitutes the reference level input terminal of the photoelectric element. In a specific implementation, as shown in FIG. 4, the anode of the photoelectric diode L is connected to the first terminal of the capacitor C1, and the cathode thereof is connected to a first reference voltage (high voltage as shown in the drawing) input terminal Vbias. The structure of the embodiment as shown can also achieve the corresponding process of photoelectric detection and improve the signal-to-noise ratio of the signals detected by the reading line.

The method for driving the photoelectric sensor provided by the above embodiment may be identical with the method for driving as stated previously and will not be described in detail.

According to another aspect, the disclosure also provides an array substrate. The array substrate can comprise a base, and a plurality of gate lines and data lines formed on the base, the plurality of gates and data lines dividing the array substrate into a plurality of pixel areas. The array substrate can further comprise a photoelectric sensor formed on the base, the photoelectric sensor being a photoelectric sensor according to any abovementioned embodiment.

In a specific implementation, in the abovementioned array substrate, each photoelectric sensor is arranged between two adjacent gate lines, wherein the control input terminal, to which the gate of the readout transistor is connected, is connected to the upper gate line of the two adjacent gate lines, and the readout transistor is adapted to conduct when a gate scanning pulse is applied to the gate line. The control input terminal, to which the gate of the reset transistor is connected, is connected to the lower gate line of the two adjacent gate lines, and the reset transistor is adapted to conduct when a gate scanning pulse is applied to the gate line. In a specific implementation, if the readout transistor and the reset transistor are both N-type transistors, the gate scanning pulse can be the high-level pulse as shown in FIG. 3, which makes the readout transistor and the reset transistor to conduct respectively.

In the technical solutions of the above embodiment, the process of driving the photoelectric sensor can be done with the help of the existing signal line, which reduces the structural complexity of the display substrate.

The display substrate may be the one in the LCD display device or in the organic electroluminescent display device.

According to a further aspect, the disclosure also provides a display device comprising the display substrate as stated above.

The display device can be any product or component with a display function, such as electronic paper, mobile phones, tablet computers, TVs, displays, laptops, digital frames and navigation instruments.

It is easy to understand that the display device provided herein can be an LCD display device or other types of display devices.

It is appreciated that the above embodiments are only exemplary embodiments, and the present invention should not be limited thereto. As far as those skilled in the art are concerned, various variations and modifications can be made without departing from the spirit and technical principles of the present invention and shall be deemed as falling within the protection scope of the present invention. The protection scope of the present invention depends on the protection scope of the appended claims.

The words, such as "first", "second" and "third", are used in the present application. Such a word is not intended to imply ordering but for the sake of identification. For instance, the expressions "the first version" and "the second version" do not necessarily mean that the first version is just the No. 1 version or created prior to the second version, or the first version is required or operated before the second version. In fact, these expressions are used to identify the different versions.

In the claims, any reference numeral in parentheses should not be interpreted as limitation to the claims. The term "comprise" does not exclude the presence of elements or steps other than those listed in the claims. The words "a" or "an" in front of elements do not exclude the presence of a plurality of such elements.

In device or system claims that enumerate several means, one or more of the means can be embodied by one and the same item of hardware. The mere fact that some measure is recited in dependent claims that are different from each other does not indicate that the combination of the measures cannot be used to advantage.

The invention claimed is:

1. A photoelectric sensor comprising a photoelectric element, an amplifying transistor, a readout transistor, a reset transistor and a capacitor, wherein the photoelectric sensor has a plurality of control input terminals, the photoelectric element comprises an output terminal and a reference level input terminal, the output terminal of the photoelectric element, a gate of the amplifying transistor and a source of the reset transistor are connected to a first terminal of the capacitor; the reference level input terminal of the photoelectric element, a source of the readout transistor and a source of the amplifying transistor are connected to a first reference voltage input terminal for inputting a first reference voltage; a drain of the reset transistor, a drain of the amplifying transistor and a second terminal of the capacitor are connected to a second reference voltage input terminal for inputting a second reference voltage; and a gate of the readout transistor and a gate of the reset transistor are respectively connected to a control input terminal,
wherein the readout transistor and the reset transistor conduct at the same level.

2. The photoelectric sensor according to claim 1, wherein the photoelectric element comprises a photoelectric transistor, the drain of the photoelectric transistor is connected to the output terminal of the photoelectric element, the source thereof is connected to the reference level input terminal of the photoelectric element, and the gate thereof is connected to a control input terminal.

3. The photoelectric sensor according to claim 2, wherein the first reference voltage is high voltage and the second reference voltage is low voltage.

4. The photoelectric sensor according to claim 1, wherein each of the transistors is an N-type transistor.

5. The photoelectric sensor according to claim 4, wherein the gate of the photoelectric transistor is connected to the second reference voltage input terminal.

6. The photoelectric sensor according to claim 1, wherein the photoelectric element comprises a photoelectric diode, an anode of the photoelectric diode is connected to the output terminal of the photoelectric element, and a cathode thereof is connected to the reference level input terminal of the photoelectric element.

7. An array substrate comprising a base, and a plurality of gate lines and data lines formed on the base, the plurality of gate lines and data lines divide the array substrate into a plurality of pixel areas; and the array substrate further comprising a photoelectric sensor formed on the base, wherein the photoelectric sensor comprises a photoelectric element, an amplifying transistor, a readout transistor, a reset transistor and a capacitor, wherein the photoelectric sensor has a plurality of control input terminals, the photoelectric element comprises an output terminal and a reference level input terminal, the output terminal of the photoelectric element, a gate of the amplifying transistor and a source of the reset transistor are connected to a first terminal of the capacitor; the reference level input terminal of the photoelectric element, a source of the readout transistor and a source of the amplifying transistor are connected to a first reference voltage input terminal for inputting a first reference voltage; a drain of the reset transistor, a drain of the amplifying transistor and a second terminal of the capacitor are connected to a second reference voltage input terminal for inputting a second reference voltage; and a gate of the readout transistor and a gate of the reset transistor are respectively connected to a control input terminal, wherein the readout transistor and the reset transistor conduct at the same level.

8. A method for driving a photoelectric sensor, the photoelectric sensor comprising a photoelectric element, an amplifying transistor, a readout transistor, a reset transistor and a capacitor, the photoelectric sensor having a plurality of control input terminals, the photoelectric element comprising an output terminal and a reference level input terminal, the output terminal of the photoelectric element, a gate of the amplifying transistor and a source of the reset transistor being connected to a first terminal of the capacitor, the reference level input terminal of the photoelectric element, a source of the readout transistor and a source of the amplifying transistor being connected to a first reference voltage input terminal for inputting a first reference voltage, a drain of the reset transistor, a drain of the amplifying transistor and a second terminal of the capacitor being connected to a second reference voltage input terminal for inputting a second reference voltage, and a gate of the readout transistor and a gate of the reset transistor being respectively connected to a control input terminal, the method comprising the steps of:

in a readout phase, applying a control signal to a control input terminal to which the gate of the readout transistor is connected so as to make the readout transistor conduct; and in a reset phase, applying a control signal to a control input terminal to which the gate of the reset transistor is connected so as to make the reset transistor conduct, wherein the readout transistor and the reset transistor conduct at the same level.

9. A display device comprising an array substrate, wherein the array substrate comprises a base, and a plurality of gate lines and data lines formed on the base, the plurality of gate lines and data lines divide the array substrate into a plurality of pixel areas; and wherein the array substrate further comprises a photoelectric sensor formed on the base, wherein the photoelectric sensor comprises a photoelectric element, an amplifying transistor, a readout transistor, a reset transistor and a capacitor, and having a plurality of control input terminals, wherein the photoelectric element comprises an output terminal and a reference level input terminal, the output terminal of the photoelectric element, the gate of the amplifying transistor and the source of the reset transistor are connected to a first terminal of the capacitor; the reference level input terminal of the photoelectric element, the source of the readout transistor and the source of the amplifying transistor are connected to a first reference voltage input terminal for inputting a first reference voltage; the drain of the reset transistor, the drain of the amplifying transistor and a second terminal of the capacitor are connected to a second reference voltage input terminal for inputting a second reference voltage; and the gate of the readout transistor and the gate of the reset transistor are respectively connected to a control input terminal, wherein the readout transistor and the reset transistor conduct at the same level.

10. The array substrate according to claim 7, wherein the photoelectric element comprises a photoelectric transistor, the drain of the photoelectric transistor is connected to the output terminal of the photoelectric element, the source thereof is connected to the reference level input terminal of the photoelectric element, and the gate thereof is connected to a control input terminal.

11. The array substrate according to claim 10, wherein the first reference voltage is high voltage and the second reference voltage is low voltage.

12. The array substrate according to claim 7, wherein each of the transistors is an N-type transistor.

13. The array substrate according to claim 12, wherein the gate of the photoelectric transistor is connected to the second reference voltage input terminal.

14. The array substrate according to claim 7, wherein the photoelectric element comprises a photoelectric diode, an anode of the photoelectric diode is connected to the output terminal of the photoelectric element, and a cathode thereof is connected to the reference level input terminal of the photoelectric element.

15. The array substrate according to claim 7, wherein each photoelectric sensor is arranged between two adjacent gate lines, wherein a control input terminal, to which the gate of a readout transistor is connected, is connected to the upper gate line of the two adjacent gate lines, and the readout transistor is adapted to conduct when a gate scanning pulse is applied to the gate line; and a control input terminal, to which the gate of a reset transistor is connected, is connected to the lower gate line of the two adjacent gate lines, and the reset transistor is adapted to conduct when a gate scanning pulse is applied to the gate line.

16. The array substrate according to claim 15, wherein each of the transistors is an N-type transistor.

* * * * *